(12) United States Patent
Lee et al.

(10) Patent No.: US 11,049,766 B2
(45) Date of Patent: Jun. 29, 2021

(54) ETCH STOP LAYER FOR SEMICONDUCTOR STRUCTURE

(71) Applicant: XIA TAI XIN SEMICONDUCTOR (QING DAO) LTD., Qingdao (CN)

(72) Inventors: Sang-Woo Lee, Singapore (SG); Keewoung Choi, Singapore (SG); Sung-Ki Kim, Singapore (SG)

(73) Assignee: XIA TAI XIN SEMICONDUCTOR (QING DAO) LTD., Qingdao (CN)

( * ) Notice: Subject to any disclaimer, the term of this patent is extended or adjusted under 35 U.S.C. 154(b) by 0 days.

(21) Appl. No.: 16/679,334

(22) Filed: Nov. 11, 2019

(65) Prior Publication Data

US 2020/0219764 A1    Jul. 9, 2020

Related U.S. Application Data

(60) Provisional application No. 62/781,626, filed on Dec. 19, 2018.

(51) Int. Cl.
*H01L 21/768* (2006.01)
*H01L 21/02* (2006.01)
*H01L 21/311* (2006.01)
*H01L 21/762* (2006.01)

(52) U.S. Cl.
CPC .. *H01L 21/76829* (2013.01); *H01L 21/02126* (2013.01); *H01L 21/02381* (2013.01); *H01L 21/02505* (2013.01); *H01L 21/311* (2013.01); *H01L 21/762* (2013.01)

(58) Field of Classification Search
None
See application file for complete search history.

(56) References Cited

U.S. PATENT DOCUMENTS

| 6,657,284 B1 * | 12/2003 | Li | H01L 21/76801 257/649 |
| 2014/0073097 A1 * | 3/2014 | Chung | H01L 29/7848 438/229 |
| 2018/0315648 A1 * | 11/2018 | Ke | H01L 21/76813 |

* cited by examiner

*Primary Examiner* — Alexander G Ghyka
(74) *Attorney, Agent, or Firm* — ScienBiziP, P.C.

(57) ABSTRACT

A semiconductor structure is disclosed. The semiconductor structure includes a base layer and an etch stop layer having a plurality of elements and in physical contact with the base layer. The etch stop layer have a Boron (B) element configured to improve the etch profile of the etch stop layer.

15 Claims, 5 Drawing Sheets

ETCH STOP LAYER FOR SEMICONDUCTOR STRUCTURE

CROSS-REFERENCES TO RELATED APPLICATIONS

This application claims the benefit of U.S. Provisional Patent Application No. 62/781,626 filed on Dec. 19, 2018, which is hereby incorporated by reference herein and made a part of specification.

BACKGROUND

1. Field

The present disclosure generally relates to semiconductor structure, and more particularly, semiconductor structure having an etch stop layer that improves the etch profile of the etch stop layer.

2. Related Art

In semiconductor industry, the minimum critical dimension has rapidly decreased. Thus, an overlay margin for preventing bridging of a pattern among layers during semiconductor device fabrication has also been reduced. Thus, development of solutions for providing larger process margins is necessary. In the etching process, a etch stop layer is critical for determining process margins.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
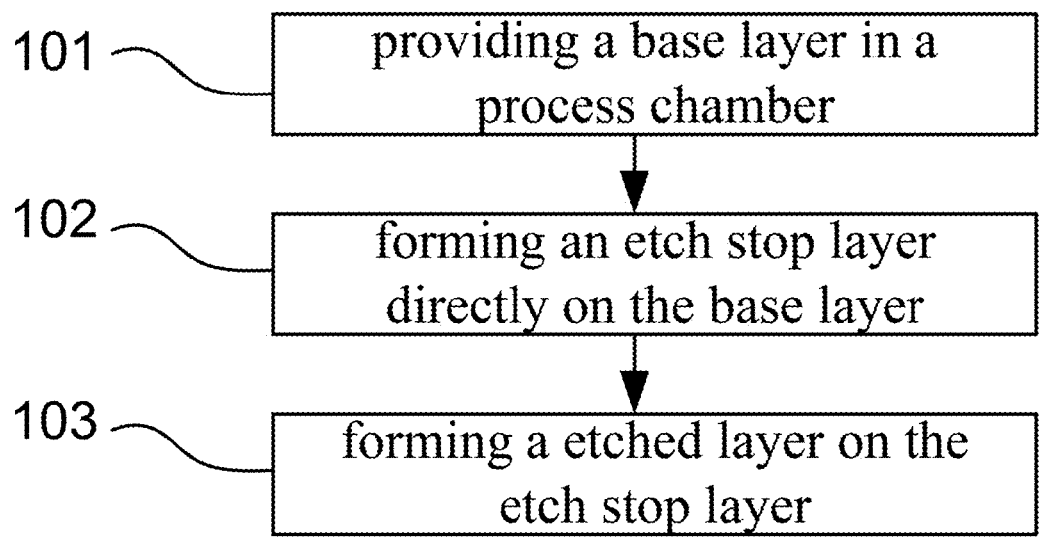
FIG. 1 illustrates a flowchart of a method of forming a semiconductor structure according to some embodiments of the instant disclosure.

The present disclosure will now be described more fully hereinafter with reference to the accompanying drawings, in which exemplary embodiments of the disclosure are shown. This disclosure may, however, be embodied in many different forms and should not be construed as limited to the exemplary embodiments set forth herein. Rather, these exemplary embodiments are provided so that this disclosure will be thorough and complete, and will fully convey the scope of the disclosure to those skilled in the art. Like reference numerals refer to like elements throughout.

The terminology used herein is for the purpose of describing particular exemplary embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 2A:
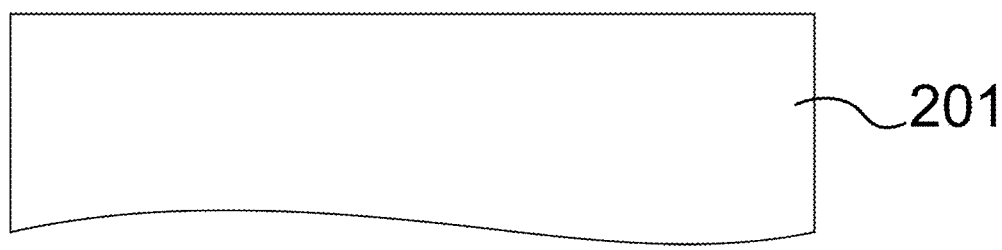
FIG. 2A-2C illustrates a cross sectional view of a semiconductor structure according to some embodiments of the instant disclosure.
Figure 2B:
Figure 2C:
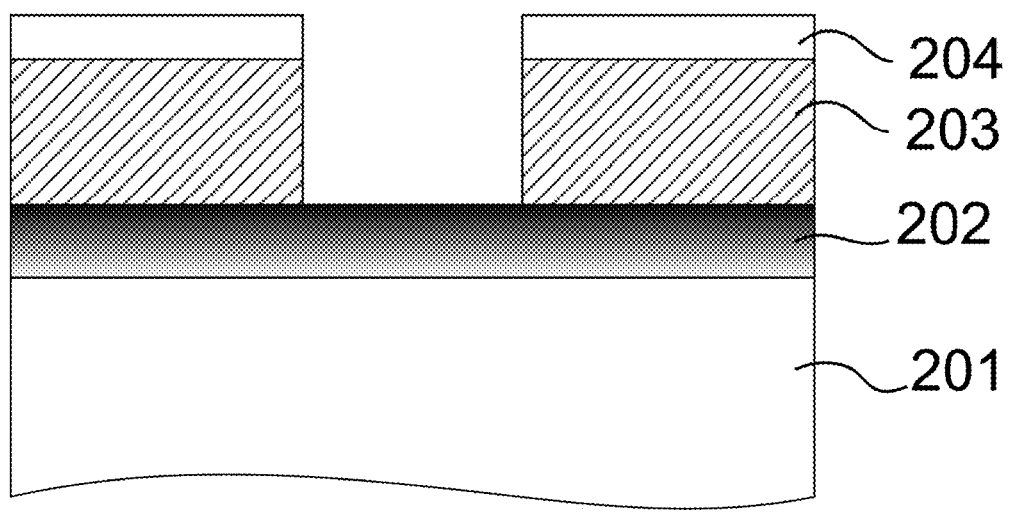

FIG. 1 illustrates a flowchart of a method of forming a semiconductor structure according to some embodiments of the instant disclosure. FIG. 2A-2C illustrates a cross sectional view of a semiconductor structure according to some embodiments of the instant disclosure. FIG. 2A-2C corresponds to each process disclosed in FIG. 1. The method includes providing a base layer in a process chamber (101), forming an etch stop layer directly on the base layer (102), and forming a etched layer on the etch stop layer (103). As shown in FIG. 2A, a base layer in a process chamber. In some embodiments, the base layer 201 includes silicon. Alternatively, the base layer 201 may include germanium, silicon germanium, gallium arsenide or other appropriate semiconductor materials. Also alternatively, the base layer 201 may include at least one of an epitaxial layer, a silicon wafer, and a silicon dioxide layer.

As shown in FIG. 2B, an etch stop layer 201 is formed directly on the base layer 201. The etch stop layer 202 are formed using Plasma Enhanced Chemical Vapor Deposition (PECVD). In some embodiments, a thickness of the etch stop layer ranges from about 100 Å to about 500 Å. In some embodiments, the etch stop layer 202 has a plurality of elements. The plurality of elements includes Silicon (Si) element and Nitrogen (N) element. In some embodiments, the plurality of elements further includes Boron (B). The Boron (B) element is configured to improve the etch profile of the etch stop layer. At least one of the plurality of elements is in gradient concentration along a thickness of the etch stop layer. In some embodiments, the etch stop layer 202 is an organic-inorganic hybrid layer, an organic layer, or an inorganic layer, such as SiN or SiBN.

In some embodiments, when forming the etch stop layer 202, the process includes providing a silicon (Si) source to the process chamber, providing a nitrogen (N) source to the process chamber, and providing a Boron (B) source to the process chamber. Silicon (Si) concentration controls the refractive index of the etch stop layer 202 and Boron (B) controls the dielectric coefficient (low k) of the film. Dielectric coefficient (low k) of the etch stop layer 202. The dielectric coefficient controls the etch resistance of the etch stop layer 202. When the Boron (B) concentration increases, the dielectric coefficient of the etch stop layer 202 decreases. The silicon (Si), Nitrogen (N) and Boron (B) may be introduced to the film using at least one of the Tetraethyl Orthosilicate (TEOS), Dichlorosilane (DCS), Ammonia (NH$_3$), Nitrogen (N$_2$), and Hydrocarbon gas.

In some embodiments, a percentage of the Nitrogen (N) source within the process chamber changes along time. In some embodiments, the percentage of the Nitrogen (N) source within the process chamber increases along time to form the etch stop layer 202 having a concentration of the Nitrogen (N) element closest to the base layer 201 be zero and increases as the etch stop layer 202 extends away from the base layer 201. In some embodiments, the percentage of the Nitrogen (N) source within the process chamber decreases along time to form the etch stop layer 202 having a concentration of the Nitrogen (N) element decrease as the etch stop layer 202 extends away from the base layer 201.

In some embodiments, a percentage of the silicon (Si) source within the process chamber changes along time. In some embodiments, the percentage of the silicon (Si) source within the process chamber increases along time to form the etch stop layer 202 having a concentration of the silicon (Si) element closest to the base layer 201 be zero and increases as the etch stop layer 202 extends away from the base layer 201. In some embodiments, the percentage of the silicon (Si) source within the process chamber decreases along time to form the etch stop layer 202 having a concentration of the silicon (Si) element decrease as the etch stop layer 202 extends away from the base layer 201.

In some embodiments, a percentage of the Boron (B) source within the process chamber changes along time. In some embodiments, the percentage of the Boron (B) source within the process chamber increases along time to form the etch stop layer 202 having a concentration of the Boron (B) element closest to the base layer 201 be zero and increases as the etch stop layer 202 extends away from the base layer 201. In some embodiments, the percentage of the Boron (B) source within the process chamber decreases along time to form the etch stop layer 202 having a concentration of the Boron (B) element decrease as the etch stop layer 202 extends away from the base layer 201.

In some embodiments, when forming the etch stop layer 202, the process includes forming a SiBN compound layer over the base layer and forming a SiN compound layer over the base layer. In some embodiments, the SiN compound layer is formed over the SiBN compound layer that is disposed above the base layer.

As shown in FIG. 2C, an etched layer 203 is formed on the etch stop layer 202. The etched layer 203 may be etched to form a pattern. When forming the pattern, the etched layer 203 is exposed to a light having a short wavelength and/or a long wavelength longer than the short wavelength. In some embodiments, the etch stop layer 202 is responsive to the short wavelength as well. The light passes through a mask 204 having the same pattern as the pattern to be formed on the etched layer 203. When the etched layer 203 is exposed to the light passing through the mask 204, the area of the etched layer 203 exposed to the light is equivalent to the pattern to be formed on the etched layer 203.

In other words, the semiconductor structure shown in FIG. 2C includes a base layer 201, an etch stop layer 202 having a plurality of elements and in physical contact with the base layer 201, and an etched layer 203 disposed on the etch stop layer 202. The plurality of elements includes Silicon (Si) element and Nitrogen (N) element. At least one of the plurality of elements is in gradient concentration along a thickness of the etch stop layer 202. In some embodiments, the plurality of elements further includes Boron (B).

Figure 3A:
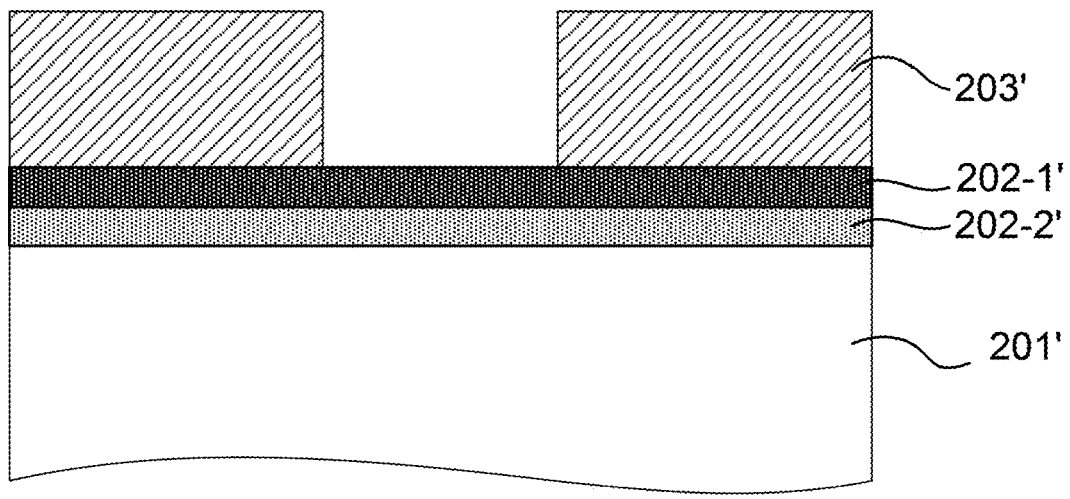
FIG. 3A-3E illustrates a cross sectional view of different types of etch stop layer of a semiconductor structure according to some embodiments of the instant disclosure.
Figure 3B:
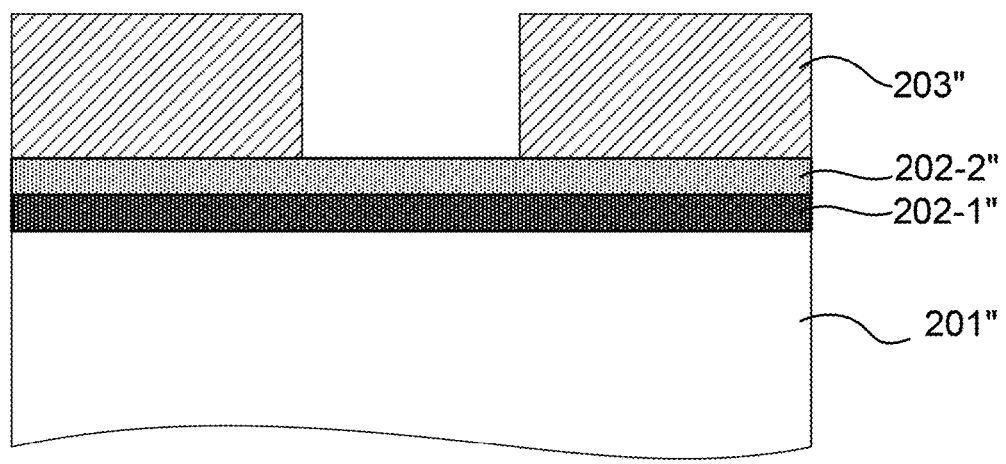
Figure 3C:
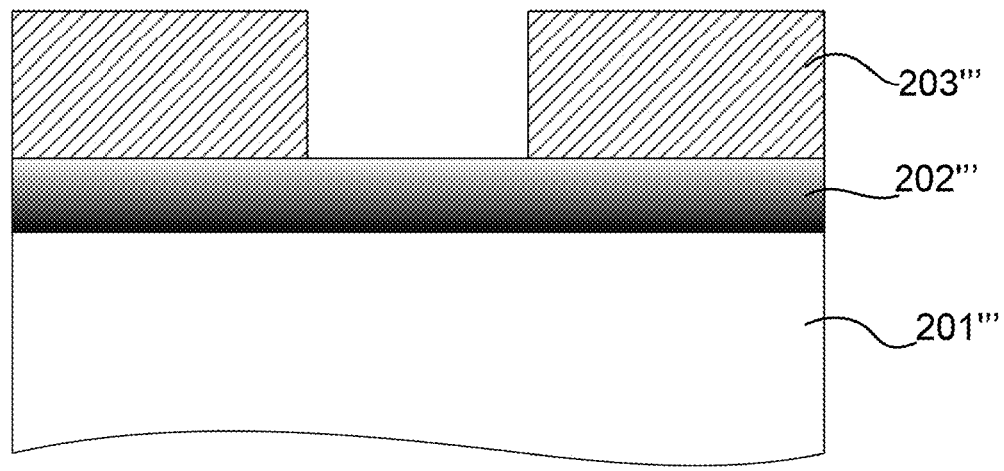

FIG. 3A-3E illustrates a cross sectional view of different types of etch stop layer of a semiconductor structure according to some embodiments of the instant disclosure. FIG. 2C and FIG. 3C shows etch stop layers 202 and 202''' having elements at gradient concentration. FIG. 2C shows an etch stop layer 202 where one or more of the plurality of elements starts at least amount (light shade) and gradually increases (dark shade) as the etch stop layer extends away from the base layer 201. FIG. 3C shows an etch stop layer 202''' where one or more of the plurality of elements starts at most amount (dark shade) and gradually decreases (light shade) as the etch stop layer extends away from the base layer 201'''.

Figure 3D:
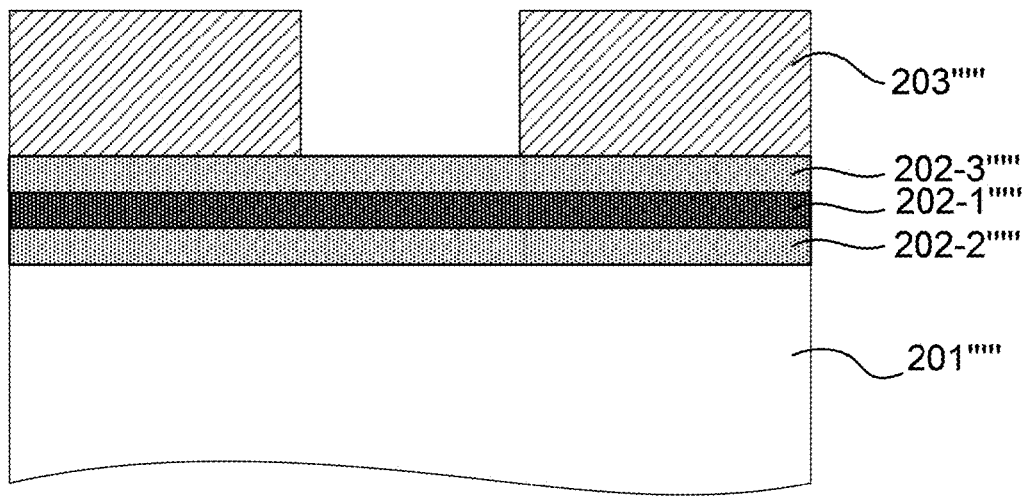
Figure 3E:
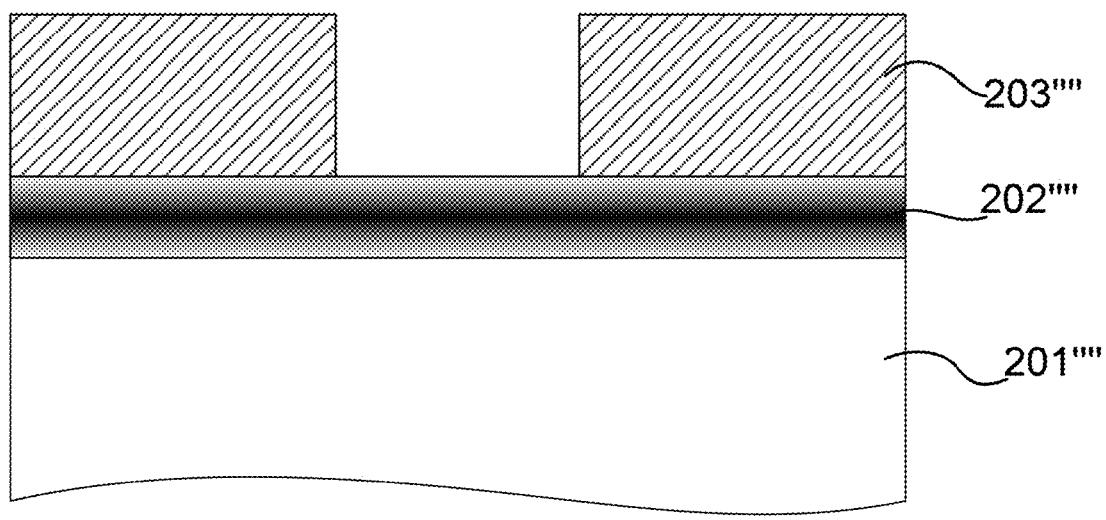

FIG. 3E shows an etch stop layer 202'''' where one or more of the plurality of elements starts at least amount (light shade) and gradually increases (dark shade) as the etch stop layer extends away from the base layer 201''''. When one or more of the plurality of elements reaches a predetermined concentration, the one or more of the plurality of elements gradually decreases until a top portion of the etch stop layer 202''''. In an exemplary embodiment, a concentration of the Boron (B) element closest to the base layer is zero, gradually increases to about 50% concentration as the etch stop layer extends away from the base layer, and gradually decreases to about 10% concentration in a top portion of the etch stop layer. In another exemplary embodiment, a concentration of the Boron (B) element farthest from the base layer is zero, gradually increases to about 50% concentration as the etch stop layer extends into the base layer, and gradually decreases to about 10% concentration in a bottom portion of the etch stop layer.

In some embodiments, a concentration of the Silicon (Si) closest to the base layer is zero and increases as the etch stop layer extends away from the base layer. In some embodiments, a concentration of the Silicon (Si) element farthest from the base layer is zero and increases as the etch stop layer extends into the base layer.

In some embodiments, a concentration of the Nitrogen (N) closest to the base layer is zero and increases as the etch stop layer extends away from the base layer. In some embodiments, a concentration of the Nitrogen (N) element farthest from the base layer is zero and increases as the etch stop layer extends into the base layer.

In some embodiments, a concentration of the Boron (B) closest to the base layer is zero and increases as the etch stop layer extends away from the base layer. In some embodiments, a concentration of the Boron (B) element farthest from the base layer is zero and increases as the etch stop layer extends into the base layer.

In some embodiments, the Silicon (Si) element and the Nitrogen (N) element forms a silicon nitride (SiN). A ratio between the silicon nitride and the Boron (B) element (SiN:B ratio) ranges from about 1:9 to about 9:1. The Silicon Nitride:Carbon Ratio may be varied according to RF power, substrate temperature, and gas mixture. In some embodiments, RF power ranges from 300 W to 1000 W. In some embodiments, substrate temperature ranges about 50° C. to 500° C.

FIG. 3A, 3B shows an etch stop layer having a SiBN compound layer 202-1' and 202-1'' and a SiN compound layer 202-2' and 202-2''. In FIG. 3A, the SiN compound layer 202-2' is disposed on the base layer 201' and the SiBN compound layer 202-1' is disposed on the SiN compound layer 202-2'. In some embodiments, the SiN compound layer may be about 10% to about 50% of a total thickness of the etch stop layer. In FIG. 3B, the SiBN compound layer 202-1'' is disposed on the base layer 201'' and the SiN compound layer 202-2'' is disposed on the SiBN compound layer 202-1". In some embodiments, the SiN compound layer may be about 10% to about 50% of a total thickness of the etch stop layer.

FIG. 3D shows an etch stop layer having a SiBN compound layer 202-1""' and two SiN compound layer 202-2""' and 202-3""'. The two SiN compound layer includes a top SiN compound layer 202-3""' and a bottom SiN compound layer 202-2""'. The SiBN compound layer 202-1""' is disposed between the top SiN compound layer 202-3""' and the bottom SiN compound layer 202-2""'. The top SiN compound layer 202-3""' may be about 10% to about 50% of a total thickness of the etch stop layer. A thickness of the bottom SiN compound layer 202-2""' is about 20 Å. The bottom SiN compound layer 202-2""' may be use as a barrier between the SiBN compound layer 202-1""' and the base layer 201""'.

Figure 4:
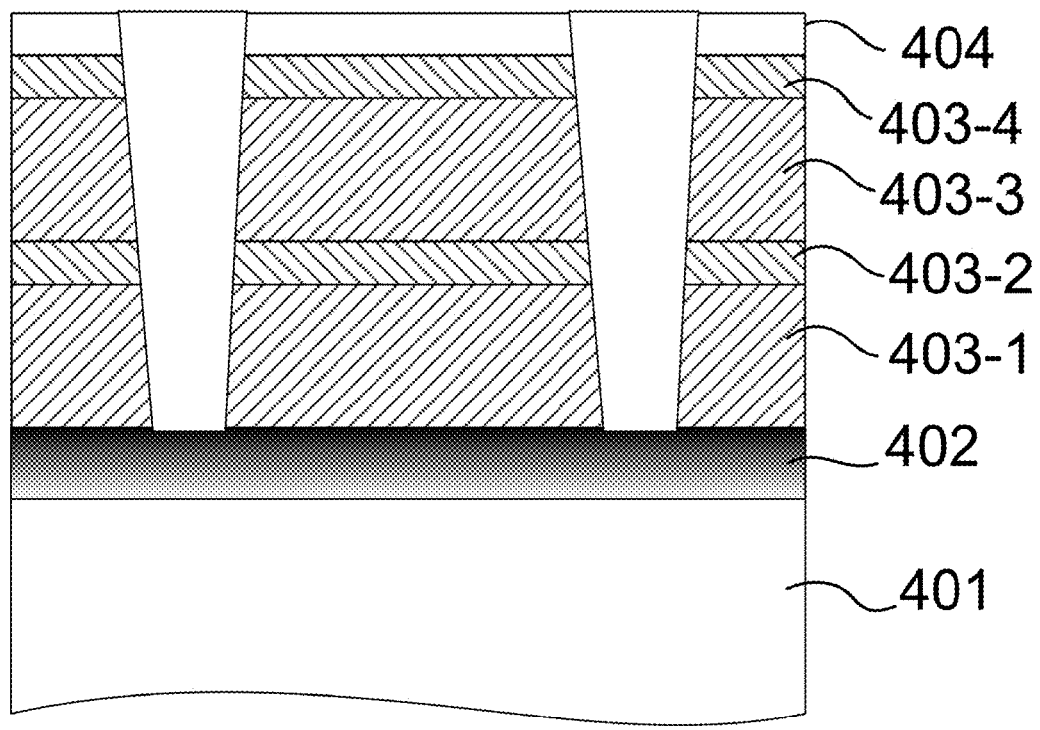
FIG. 4 illustrates a cross sectional view of a semiconductor structure according to some embodiments of the instant disclosure.

FIG. 4 illustrates a cross sectional view of a semiconductor structure according to some embodiments of the instant disclosure. The semiconductor structure shown in FIG. 4 includes a base layer 401, an etch stop layer 402 having a plurality of elements and in physical contact with the base layer 401, and an etched layer disposed on the etch stop layer 402. The etched layer comprises a plurality of interlayers 403-1 to 402-4. The interlayers 403-1 and 403-3 may be oxide layers. The interlayers 403-2 and 403-4 may be support layers. The etch stop layer 402 may be any one or combinations of the etch stop layers disclosed in FIGS. 2C to 3E.

As disclosed in the embodiments of FIGS. 2C to 3E, the etch stop layer may have a thickness of about 100 Å to about 500 Å. The Boron (B) element concentration in the etch stop layer may range between about 10% to about 50%. The thickness of the SiN compound layer may be about 10% to about 50% of the total thickness of the etch stop layer. The SiBN compound layer may be about 50% of the total thickness of the etch stop layer. The SiBN compound layer may be used to improve the anistotropic etching profile and uniform bottom recess profile of the semiconductor structure.

Accordingly, one aspect of the instant disclosure provides a semiconductor structure that comprises a base layer; and an etch stop layer having a plurality of elements and in physical contact with the base layer. The plurality of elements includes Silicon (Si) element, Boron (B) element, and Nitrogen (N) element. In some embodiments, at least one of the plurality of elements is in gradient concentration along a thickness of the etch stop layer.

In some embodiments, a concentration of the Boron (B) element closest to the base layer is zero and increases as the etch stop layer extends away from the base layer.

In some embodiments, a concentration of the Boron (B) element farthest from the base layer is zero and increases as the etch stop layer extends into the base layer.

In some embodiments, the Silicon (Si) element and the Nitrogen (N) element forms a silicon nitride, and a ratio between the silicon nitride and the Boron (B) element (SiN:B ratio) ranges from about 1:9 to about 9:1.

In some embodiments, the etch stop layer comprising a SiBN compound layer and a top SiN compound layer disposed above the SiBN compound layer.

In some embodiments, the top SiN compound layer is about 10% to about 50% of a total thickness of the etch stop layer.

In some embodiments, the etch stop layer further comprising a bottom SiN compound layer disposed below the SiBN compound layer.

In some embodiments, the bottom SiN compound layer has a thickness of about 20 Å.

In some embodiments, a concentration of the Boron (B) element closest to the base layer is zero, gradually increases to about 50% concentration as the etch stop layer extends away from the base layer, and gradually decreases to about 10% concentration in a top portion of the etch stop layer.

In some embodiments, a concentration of the Boron (B) element farthest from the base layer is zero, gradually increases to about 50% concentration as the etch stop layer extends into the base layer, and gradually decreases to about 10% concentration in a bottom portion of the etch stop layer.

In some embodiments, a thickness of the etch stop layer ranges from about 100 Å to about 500 Å.

Accordingly, another aspect of the instant disclosure provides a method of forming a semiconductor structure that comprises providing a base layer in a process chamber; and forming an etch stop layer directly on the base layer, the etch stop layer having a plurality of elements. The plurality of elements includes Silicon (Si) element, Nitrogen (N) element, and Boron (B) element. At least one of the plurality of elements is in gradient concentration along a thickness of the etch stop layer.

In some embodiments, the percentage of the Boron (B) source within the process chamber increases along time to form the etch stop layer having a concentration of the Boron (B) element closest to the base layer be zero and increases as the etch stop layer extends away from the base layer.

In some embodiments, the percentage of the Boron (B) source within the process chamber decreases along time to form the etch stop layer having a concentration of the Boron (B) element decrease as the etch stop layer extends away from the base layer.

In some embodiments, the percentage of the Boron (B) source within the process chamber changes along time to form the etch stop layer having a concentration of the Boron (B) element closest to the base layer be zero, gradually increases to about 50% concentration as the etch stop layer extends away from the base layer, and gradually decreases to about 10% concentration in a top portion of the etch stop layer.

In some embodiments, the percentage of the Boron (B) source within the process chamber changes along time to form the etch stop layer having a concentration of the Boron (B) element farthest from the base layer is zero, gradually increases to about 50% concentration as the etch stop layer extends into the base layer, and gradually decreases to about 10% concentration in a bottom portion of the etch stop layer.

In some embodiments, forming the etch stop layer comprises forming a SiBN compound layer over the base layer; and forming a top SiN compound layer over the SiBN compound layer.

In some embodiments, forming the etch stop layer further comprises forming a bottom SiN compound layer over the base layer.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure, comprising:
   a base layer; and
   an etch stop layer having a plurality of elements and in physical contact with the base layer;

wherein the plurality of elements includes Silicon (Si) element, Boron (B) element, and Nitrogen (N) element;

wherein the etch stop layer has a Boron (B) concentration distribution that has a greatest value at a middle portion of the etch stop layer and decreases there-from upwardly and downwardly along a thickness direction.

2. The semiconductor structure of claim 1, wherein the Silicon (Si) element and the Nitrogen (N) element forms a silicon nitride, and a ratio between the silicon nitride and the Boron (B) element (SiN:B ratio) ranges from about 1:9 to about 9:1.

3. The semiconductor structure of claim 1, wherein the etch stop layer comprising a SiBN compound layer and a top SiN compound layer disposed above the SiBN compound layer.

4. The semiconductor structure of claim 3, wherein the top SiN compound layer is about 10% to about 50% of a total thickness of the etch stop layer.

5. The semiconductor structure of claim 3, wherein the etch stop layer further comprising a bottom SiN compound layer disposed below the SiBN compound layer.

6. The semiconductor structure of claim 3, wherein the bottom SiN compound layer has a thickness of about 20 Å.

7. The semiconductor structure of claim 1, wherein a concentration of the Boron (B) element closest to the base layer is zero, gradually increases to about 50% concentration as the etch stop layer extends away from the base layer, and gradually decreases to about 10% concentration in a top portion of the etch stop layer.

8. The semiconductor structure of claim 1, wherein a concentration of the Boron (B) element farthest from the base layer is zero, gradually increases to about 50% concentration as the etch stop layer extends into the base layer, and gradually decreases to about 10% concentration in a bottom portion of the etch stop layer.

9. The semiconductor structure of claim 1, wherein a thickness of the etch stop layer ranges from about 100 Å to about 500 Å.

10. A method of forming a semiconductor structure, comprising:
providing a base layer in a process chamber;
forming an etch stop layer directly on the base layer, the etch stop layer having a plurality of elements; and
wherein the plurality of elements includes Silicon (Si) element, Nitrogen (N) element, and Boron (B) element;
wherein the etch stop layer has a Boron (B) concentration distribution that has a greatest value at a middle portion of the etch stop layer and decreases there-from upwardly and downwardly along a thickness direction.

11. The method of claim 10, wherein forming the etch stop layer comprises:
providing a silicon (Si) source to the process chamber;
providing a Nitrogen (N) source to the process chamber; and
providing a Boron (B) source to the process chamber;
wherein a percentage of the Boron (B) source within the process chamber changes along time.

12. The method of claim 11, wherein the percentage of the Boron (B) source within the process chamber changes along time to form the etch stop layer having a concentration of the Boron (B) element closest to the base layer be zero, gradually increases to about 50% concentration as the etch stop layer extends away from the base layer, and gradually decreases to about 10% concentration in a top portion of the etch stop layer.

13. The method of claim 11, wherein the percentage of the Boron (B) source within the process chamber changes along time to form the etch stop layer having a concentration of the Boron (B) element farthest from the base layer is zero, gradually increases to about 50% concentration as the etch stop layer extends into the base layer, and gradually decreases to about 10% concentration in a bottom portion of the etch stop layer.

14. The method of claim 10, wherein forming the etch stop layer comprises:
forming a SiBN compound layer over the base layer; and
forming a top SiN compound layer over the SiBN compound layer.

15. The method of claim 14, wherein forming the etch stop layer further comprises:
forming a bottom SiN compound layer over the base layer.

* * * * *